United States Patent
Okamura

(10) Patent No.: US 10,763,390 B2
(45) Date of Patent: Sep. 1, 2020

(54) OPTICAL DEVICE WAFER PROCESSING METHOD

(71) Applicant: DISCO CORPORATION, Tokyo (JP)

(72) Inventor: Takashi Okamura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 101 days.

(21) Appl. No.: 15/876,423

(22) Filed: Jan. 22, 2018

(65) Prior Publication Data

US 2018/0212098 A1 Jul. 26, 2018

(30) Foreign Application Priority Data

Jan. 23, 2017 (JP) .................................. 2017-009433

(51) Int. Cl.

| | |
|---|---|
| *H01L 33/00* | (2010.01) |
| *H01L 33/32* | (2010.01) |
| *H01L 33/20* | (2010.01) |
| *B23K 26/364* | (2014.01) |
| *H01L 21/78* | (2006.01) |
| *B28D 5/00* | (2006.01) |

(52) U.S. Cl.
CPC ........ *H01L 33/0093* (2020.05); *B23K 26/364* (2015.10); *H01L 33/0095* (2013.01); *B28D 5/0011* (2013.01); *H01L 21/78* (2013.01); *H01L 33/20* (2013.01); *H01L 33/32* (2013.01)

(58) Field of Classification Search
None
See application file for complete search history.

(56) References Cited

U.S. PATENT DOCUMENTS

| 4,814,296 A | * | 3/1989 | Jedlicka | B27G 19/10 |
| | | | | 148/DIG. 28 |
| 5,128,282 A | * | 7/1992 | Ormond | H01L 21/304 |
| | | | | 257/E21.237 |
| 5,219,796 A | * | 6/1993 | Quinn | H01L 21/304 |
| | | | | 148/DIG. 28 |
| RE43,400 E | * | 5/2012 | O'Brien | B23K 26/032 |
| | | | | 264/400 |
| 9,034,731 B2 | * | 5/2015 | Park | H01L 21/78 |
| | | | | 438/460 |
| 2003/0047543 A1 | * | 3/2003 | Peng | B28D 1/221 |
| | | | | 219/121.68 |

(Continued)

FOREIGN PATENT DOCUMENTS

JP         10-305420         11/1998

*Primary Examiner* — Erik T. K. Peterson
(74) *Attorney, Agent, or Firm* — Greer Burns & Crain Ltd.

(57) ABSTRACT

An optical device wafer processing method for dividing an optical device wafer along a plurality of division lines to obtain a plurality of individual device chips includes applying a laser beam to a wafer substrate along each division line to thereby form a laser processed groove along each division line, and next forming a V groove along each laser processed groove on the optical device wafer by using a cutting blade having a V-shaped tip in the condition where each laser processed groove is removed by the cutting blade. A crack is formed so as to extend from the bottom of each laser processed groove due to a load applied from the cutting blade, thereby dividing the optical device wafer into the individual device chips. The depth of each laser processed groove is set smaller than the depth of cut by the cutting blade.

9 Claims, 4 Drawing Sheets

(56) References Cited

U.S. PATENT DOCUMENTS

| | | | | |
|---|---|---|---|---|
| 2005/0035099 | A1* | 2/2005 | Nakamura | B28D 5/022 219/121.72 |
| 2005/0035100 | A1* | 2/2005 | Genda | B28D 5/022 219/121.72 |
| 2005/0101109 | A1* | 5/2005 | Chin | H01L 21/67092 438/464 |
| 2005/0106782 | A1* | 5/2005 | Genda et al. | B23K 26/18 438/118 |
| 2005/0130390 | A1* | 6/2005 | Andrews | B28D 1/221 438/458 |
| 2005/0266680 | A1* | 12/2005 | Daskal | A61B 17/3211 438/637 |
| 2006/0148211 | A1* | 7/2006 | Iwasaki | H01L 21/67092 438/462 |
| 2006/0189099 | A1* | 8/2006 | Lu | H01L 21/78 438/460 |
| 2007/0298529 | A1* | 12/2007 | Maeda | B28D 5/0011 438/33 |
| 2008/0121906 | A1* | 5/2008 | Yakushiji | H01L 33/0095 257/94 |
| 2008/0194080 | A1* | 8/2008 | Cheng | H01L 33/0095 438/463 |
| 2008/0299745 | A1* | 12/2008 | Morikazu | B28D 5/0011 438/463 |
| 2009/0179304 | A1* | 7/2009 | Takata | H01L 21/561 257/620 |
| 2009/0243097 | A1* | 10/2009 | Koroku | H01L 21/561 257/737 |
| 2009/0267065 | A1* | 10/2009 | Horio | H01L 33/16 257/43 |
| 2010/0065843 | A1* | 3/2010 | Kyotani | H01L 33/0095 257/43 |
| 2012/0083059 | A1* | 4/2012 | Hoshino | H01L 33/0095 438/33 |
| 2012/0156816 | A1* | 6/2012 | Okamura | B28D 5/0011 438/33 |
| 2014/0017837 | A1* | 1/2014 | Kim | H01L 33/0095 438/33 |
| 2015/0140702 | A1* | 5/2015 | Ikeda | H01L 33/56 438/27 |
| 2016/0056080 | A1* | 2/2016 | Takahashi | H01L 21/78 438/462 |
| 2016/0204074 | A1* | 7/2016 | Lin | H01L 21/784 257/76 |
| 2018/0212098 | A1* | 7/2018 | Okamura | H01L 33/0079 |

* cited by examiner

OPTICAL DEVICE WAFER PROCESSING METHOD

BACKGROUND OF THE INVENTION

Field of the Invention

The present invention relates to an optical device wafer processing method for dividing an optical device wafer along division lines.

Description of the Related Art

A functional layer of hexagonal single crystal such as SiC and GaN is formed on a substrate, and this functional layer is partitioned by a plurality of crossing division lines to thereby form a plurality of optical devices such as power devices, light emitting diodes (LEDs), and laser diodes (LDs) on the substrate. Thus, an optical device wafer having the plural optical devices on the front side is obtained. As a method of dividing the optical device wafer along the division lines to obtain a plurality of individual device chips, there has been proposed a method including the steps of applying a pulsed laser beam having an absorption wavelength to the substrate along each division line to thereby form a laser processed groove as a break start point along each division line, and next applying an external force along each laser processed groove to thereby divide the optical device wafer along each division line (see Japanese Patent Laid-open No. Hei 10-305420, for example).

SUMMARY OF THE INVENTION

There is a demand that inclined surfaces are formed on the back side of each device chip to make a substantially trapezoidal cross section for the purpose of further improving the luminance of each device chip. In this case, the inclined surfaces of each device chip are formed by cutting the back side of the optical device wafer along each division line with a V blade to thereby form a V groove along each division line. However, the substrate of the optical device wafer is formed of a hard material having high Mohs hardness in many cases, so that there is a possibility that cracks may be formed on the side surfaces of each device chips by the cutting operation using the V blade, causing a reduction in quality of each device chip. Further, the V groove cannot be formed on the optical device wafer by laser processing. Thus, it is difficult to form the inclined surfaces of each device chip.

It is therefore an object of the present invention to provide an optical device wafer processing method which can form the inclined surfaces of each device chip even when the substrate of the optical device wafer has high Mohs hardness.

In accordance with an aspect of the present invention, there is provided an optical device wafer processing method for dividing an optical device wafer along a plurality of division lines formed on the front side of the optical device wafer to obtain a plurality of individual device chips, the optical device wafer being composed of a wafer substrate and a light emitting layer formed on the wafer substrate, the light emitting layer having a plurality of optical devices individually corresponding to the device chips, the optical device wafer processing method including a laser processed groove forming step of applying a laser beam having an absorption wavelength to the wafer substrate, to the optical device wafer along each division line, thereby forming a laser processed groove along each division line on the optical device wafer; and a V groove dividing step of forming a V groove along each laser processed groove on the optical device wafer by using a cutting blade having a V-shaped tip in the condition where each laser processed groove is removed by the cutting blade, after performing the laser processed groove forming step, and simultaneously dividing the optical device wafer into the individual device chips by forming a crack extending from the bottom of each laser processed groove due to a load applied from the cutting blade; the depth of each laser processed groove being set smaller than the depth of cut by the cutting blade.

In accordance with another aspect of the present invention, there is provided an optical device wafer processing method for dividing an optical device wafer along a plurality of division lines formed on the front side of the optical device wafer to obtain a plurality of individual device chips, the optical device wafer being composed of a wafer substrate and a light emitting layer formed on the wafer substrate, the light emitting layer having a plurality of optical devices individually corresponding to the device chips, the optical device wafer processing method including a laser processed groove forming step of applying a laser beam having an absorption wavelength to the wafer substrate, to the optical device wafer along each division line, thereby forming a laser processed groove along each division line on the optical device wafer; a V groove forming step of forming a V groove along each laser processed groove on the optical device wafer by using a cutting blade having a V-shaped tip in the condition where each laser processed groove is removed by the cutting blade, after performing the laser processed groove forming step; and a dividing step of applying an external force to the optical device wafer along each V groove after performing the V groove forming step, thereby dividing the optical device wafer into the individual device chips; the depth of each laser processed groove being set smaller than the depth of cut by the cutting blade.

With these configurations, the V groove is formed by the cutting blade on the optical device wafer along each division line where the laser processed groove has been formed to reduce the strength of the wafer. At this time, a processing load is applied from the cutting blade to the optical device wafer along each laser processed groove in forming the V groove, so that excess load is hardly applied to the side surfaces of the V groove and the generation of cracks on the side surface of each device chip can therefore be suppressed. Further, a plurality of inclined surfaces are formed on each device chip by the side surfaces of each V groove formed on the optical device wafer, thereby increasing the amount of light to be extracted from each device chip and accordingly improving the luminance.

Preferably, the laser processed groove forming step includes the step of forming a plurality of laser processed grooves along each division line in an area where the optical device wafer is to be removed by the cutting blade, whereby the amount of the optical device wafer to be removed by the cutting blade is reduced in the V groove dividing step.

According to the present invention, the laser processed groove is formed along each division line on the optical device wafer, and the V groove is next formed along each laser processed groove by the cutting blade. Accordingly, even when the wafer substrate has high Mohs hardness, the inclined surfaces can be formed on each device chip.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
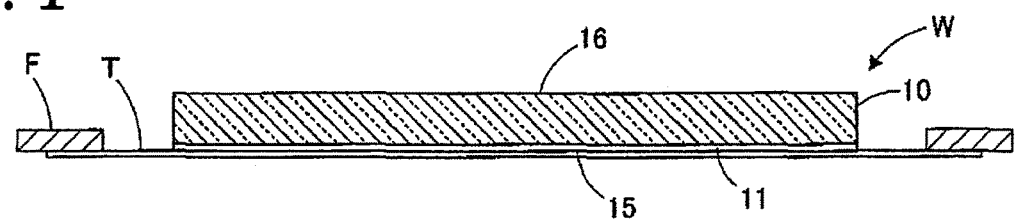
FIG. 1 is a sectional view of an optical device wafer.
Figure 2A:
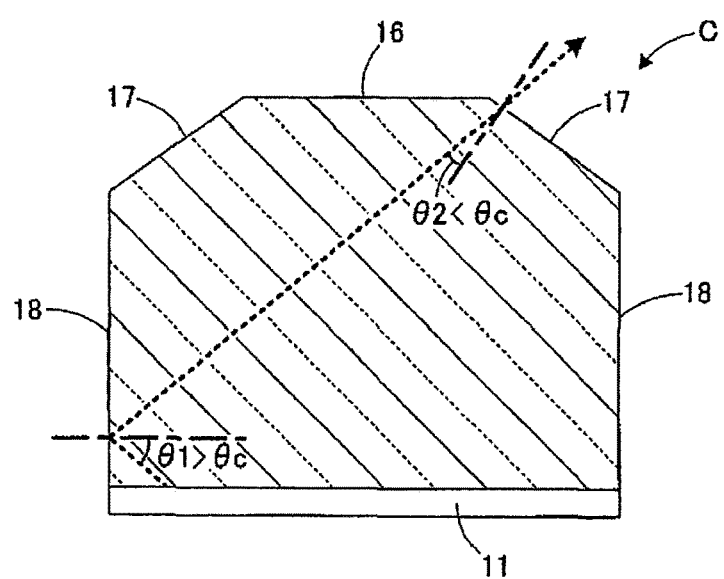
FIGS. 2A and 2B are sectional views of device chips different in shape.
Figure 2B:
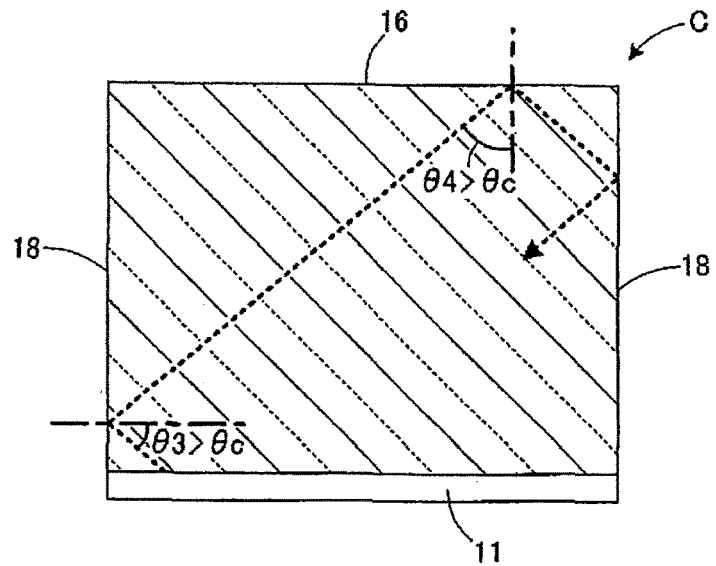

An optical device wafer processing method according to preferred embodiments will now be described with reference to the attached drawings. FIG. 1 is a sectional view of an optical device wafer W. FIGS. 2A and 2B are sectional views of device chips C different in shape. The following preferred embodiments are merely illustrative and the present invention is not limited to the preferred embodiments.

As shown in FIG. 1, the optical device wafer W is a GaN wafer, for example, which is composed of a wafer substrate 10 of sapphire or the like and a light emitting layer 11 of GaN base compound formed on the wafer substrate 10 by epitaxial growth. The light emitting layer 11 of the optical device wafer W is partitioned by a plurality of crossing division lines to thereby form a plurality of optical devices such as LEDs. The optical device wafer W has a front side 15 and a back side 16. The front side 15 of the optical device wafer W corresponds to the front side of the light emitting layer 11. A support tape T is attached at its central portion to the front side 15 of the optical device wafer W, and a ring frame F is attached to a peripheral portion of the support tape T. Thus, the optical device wafer W is supported through the support tape T to the ring frame F and transferred in this supported condition.

As shown in FIG. 2A, the device chip C is obtained by dividing the optical device wafer W. The device chip C corresponding to each optical device has a plurality of inclined surfaces 17 on the back side 16, so as to meet the requirement for improving the luminance of the device chip C. When light emitted from the light emitting layer 11 impinges on the outer surface of the device chip C at an incident angle θ1 greater than a critical angle θc, the light is totally reflected on the outer surface of the device chip C. In contrast, when the light impinges on the outer surface of the device chip C at an incident angle θ2 less than the critical angle θc, the light is transmitted through the outer surface of the device chip C. Accordingly, by forming the inclined surfaces 17 on the back side 16 of the device chip C, the repetition of the total reflection of the light in the device chip C can be prevented by the inclined surfaces 17, so that the light is emerged from the device chip C to improve the light extraction efficiency.

On the other hand, the device chip C shown in FIG. 2B has no inclined surfaces on the back side 16. In this case, a part of the light emitted from the light emitting layer 11 is less prone to being emerged from the device chip C. More specifically, the light emitted from the light emitting layer 11 impinges on the side surface 18 of the device chip C at an incident angle θ3 greater than the critical angle θc, and next impinges on the back side 16 of the device chip C at an incident angle θ4 greater than the critical angle θc. As a result, the total reflection of the light is repeated in the device chip C to cause the extinction of the light in some case. Thus, in the case that the device chip C has a rectangular prismatic shape as shown in FIG. 2B, the reflection angle of a part of the light emitted from the light emitting layer 11 is preserved in the device chip C to cause a reduction in light extraction efficiency.

In forming the inclined surfaces 17 on the back side 16 of the device chip C, it is necessary to use a cutting blade having a V-shaped tip (which will be hereinafter referred to as "V blade 33" (see FIG. 3B)), thereby forming V grooves on the back side 16 of the optical device wafer W. However, the wafer substrate 10 is formed of a hard material having high Mohs hardness, such as sapphire, so that there is a problem such that cracks may irregularly extend in the wafer substrate 10 due to a processing load in cutting the wafer substrate 10 by using the V blade 33. Further, in forming the V grooves on the wafer substrate 10, the V blade 33 is worn severely to cause the loss of the original V-shape at the tip.

To cope with this problem, the optical device wafer processing method according to this preferred embodiment includes the steps of forming a laser processed groove 12 (see FIG. 3A) on the back side 16 of the optical device wafer W along each division line and next forming a V groove 13 (see FIG. 3B) along each laser processed groove 12 by using the V blade 33. Accordingly, the strength of the optical device wafer W can be reduced along each division line, and each laser processed groove 12 functions as a crevice where a processing load is applied in forming the V groove 13 by the use of the V blade 33. Thus, the processing load is applied along each laser processed groove 12 in forming the V groove 13, so that no cracks are left in each device chip C obtained by dividing the optical device wafer W along each division line. Further, the machinability of the optical device wafer W can be improved to suppress the severe wearing of the V blade 33.

Figure 3A:
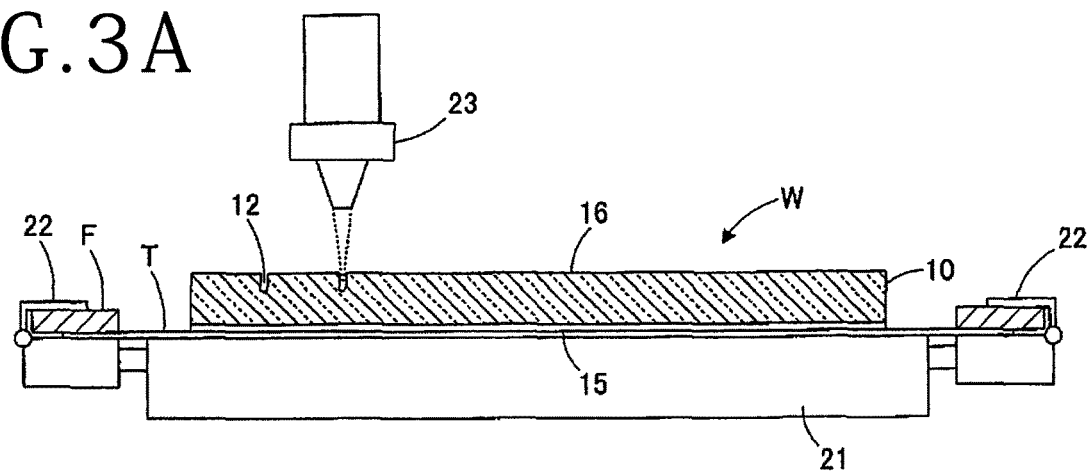
FIGS. 3A, 3B, and 3C are sectional views for illustrating an optical device wafer processing method according to a first embodiment of the present invention.
Figure 3B:
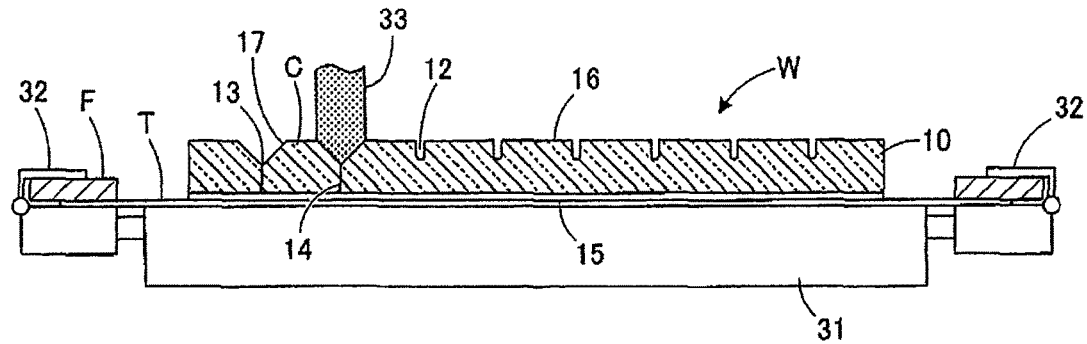
Figure 3C:
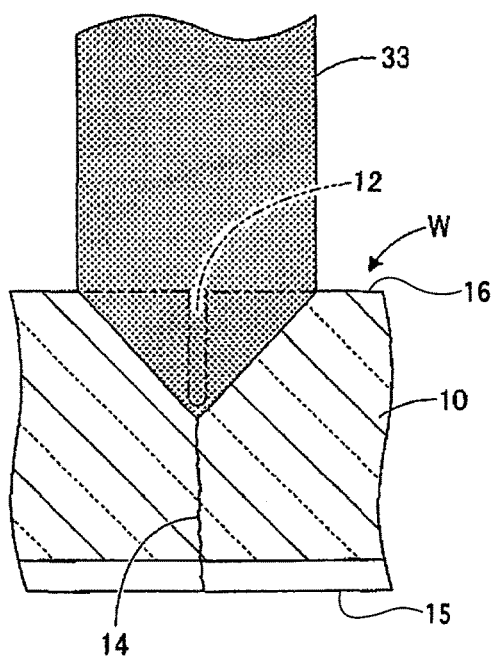

An optical device wafer processing method according to a first embodiment of the present invention will now be described with reference to FIGS. 3A, 3B, and 3C. FIGS. 3A, 3B, and 3C are sectional views for illustrating the optical device wafer processing method according to the first embodiment. More specifically, FIG. 3A is a sectional view showing a laser processed groove forming step in the optical device wafer processing method, and FIGS. 3B and 3C are sectional views showing a V groove dividing step in the optical device wafer processing method.

As shown in FIG. 3A, the laser processed groove forming step is first performed to form a laser processed groove 12 on the back side 16 of the optical device wafer W along each division line. In the laser processed groove forming step, the optical device wafer W is held through the support tape T on a chuck table 21 included in a laser processing apparatus (not shown), and the ring frame F supporting the optical device wafer W through the support tape T is fixed by clamps 22 provided on the outer circumference of the chuck table 21. In this condition, the lower end (laser outlet opening) of a laser head 23 included in the laser processing apparatus is positioned directly above a target one of the division lines of the optical device wafer W in the condition where the back side 16 is exposed upward, and a laser beam is then applied from the laser head 23 to the back side 16 of the optical device wafer W. The laser beam has an absorption wavelength to the wafer substrate 10.

The focal point of the laser beam is adjusted and the laser head 23 is horizontally moved relative to the optical device wafer W along the target division line, so that the laser processed groove 12 is formed by ablation on the back side 16 of the optical device wafer W along the target division line. This laser processing is similarly performed along all of the other division lines to thereby form a plurality of crossing laser processed grooves 12 on the back side 16 of the optical device wafer W along all the crossing division lines. As a result, the strength of the optical device wafer W is reduced in the periphery of each laser processed groove 12. Furthermore, each laser processed groove 12 functions as a crevice where the processing load by the V blade 33 (see FIG. 3B) is concentrated in forming the V groove in the next step.

The power of the laser beam is adjusted to a power capable of not only forming each laser processed groove 12 on the optical device wafer W, but also modifying the periphery of each laser processed groove 12. In other words, the power of the laser beam is adjusted to a power higher than the power required to form each laser processed groove 12. Further, the depth of each laser processed groove 12 is set smaller than the depth of cut by the V blade 33 (see FIG. 3C). In the laser processed groove forming step, a water-soluble protective film (not shown) may be previously formed on the back side 16 of the optical device wafer W, so as to prevent the deposition of debris to the back side 16.

The ablation mentioned above means a phenomenon such that when the intensity of a laser beam applied becomes equal to or greater than a predetermined processing threshold, the energy of the laser beam is converted into electronic, thermal, photochemical, and mechanical energy on the surface of a solid, so that neutral atoms, molecules, positive and negative ions, radicals, clusters, electrons, and light are explosively emitted and an emission mark is accordingly formed on the solid surface. Further, the protective film may be a water-soluble resin film capable of protecting the optical device wafer W from debris scattering in performing the ablation. Examples of the water-soluble resin include polyvinyl alcohol (PVA), polyethylene glycol (PEG), and polyethylene oxide (PEO).

After performing the laser processed groove forming step, the V groove dividing step is performed to form a V groove 13 along each laser processed groove 12 on the back side 16 of the optical device wafer W and divide the optical device wafer W along each V groove 13 as shown in FIG. 3B. In the V groove dividing step, the optical device wafer W is first held through the support tape T on a chuck table 31 included in a cutting apparatus (not shown), and the ring frame F supporting the optical device wafer W through the support tape T is fixed by clamps 32 provided on the outer circumference of the chuck table 31. Further, the V blade 33 is set radially outside the chuck table 31 so as to be aligned with a target one of the laser processed grooves 12 (the division lines) as viewed in plan. The V blade 33 is a disk-shaped cutting blade having a V-shaped tip and it is mounted on a spindle (not shown) at its front end. The V blade 33 is formed by bonding diamond abrasive grains or the like with a bond.

Thereafter, the V blade 33 is lowered to the depth from the back side 16 of the optical device wafer W to the half of the thickness of the optical device wafer W at the position radially outside the optical device wafer W, and the optical device wafer W is then fed in a horizontal direction relative to the V blade 33. As a result, the optical device wafer W is half cut along the target laser processed groove 12 to form a V groove 13 along the target laser processed groove 12 on the back side 16 of the optical device wafer W. Accordingly, the target laser processed groove 12 is removed by the V groove 13, that is, by the V blade 33, and at the same time a crack 14 extends from the bottom of the target laser processed groove 12 to the front side (lower surface) 15 of the optical device wafer W due to the processing load applied from the V blade 33, thereby dividing the optical device wafer W along the V groove 13.

In this case, the processing load by the V blade 33 is easily concentrated at the target laser processed groove 12, so that excess processing load is hardly applied to the side surfaces of the V groove 13. Accordingly, the crack 14 starts to be generated from the bottom of the target laser processed groove 12 and extends downward to the front side (lower surface) 15 of the optical device wafer W, so that the generation of cracks on the side surfaces of the V groove 13 can be suppressed. Further, since the power of the laser beam is adjusted to an increased power, the strength of the periphery of the target laser processed groove 12 can be reduced by the application of the laser beam to thereby improve the machinability. Accordingly, although the wafer substrate 10 such as a sapphire substrate has high Mohs hardness, the V groove 13 can be formed by the V blade 33 with its wearing being suppressed.

Such a cutting operation is repeated along all of the other laser processed grooves 12 to thereby form a plurality of similar V grooves 13 along all of the other laser processed grooves 12 (the division lines), thereby dividing the optical device wafer W into the individual device chips C. Accordingly, the inclined surfaces 17 of each device chip C are formed by the side surfaces of each V groove 13 of the optical device wafer W, thereby improving the light extraction efficiency of each device chip C. Further, the generation of cracks in each device chip C can be suppressed to thereby improve the quality of each device chip C. Further, since the optical device wafer W is divided by the processing load applied from the V blade 33 in forming the V groove 13, the formation of the V groove 13 and the division of the optical device wafer W can be simultaneously performed to thereby improve the productivity.

As shown in FIG. 3C, the depth of each laser processed groove 12 is set smaller than the depth of cut by the V blade 33. Accordingly, each laser processed groove 12 can be completely removed by the V blade 33 in forming the V groove 13. While debris is produced in performing the ablation to the optical device wafer W and deposited to the inside surface of each laser processed groove 12, such debris can be completely removed by completely removing each laser processed groove 12 in forming the V groove 13. Accordingly, there is no possibility that the debris may be left on the side surfaces of each device chip C, so that a reduction in luminance of each device chip C (see FIG. 3B) due to the debris can be suppressed. As a modification, the depth of each laser processed groove 12 may be set larger than the depth of cut by the V blade 33 in such a range that the debris in each laser processed groove 12 does not cause a reduction in luminance of each device chip C.

In the optical device wafer processing method according to the first embodiment described above, the V groove 13 is formed by the V blade 33 on the optical device wafer W along each division line where the laser processed groove 12 has been formed to reduce the strength of the wafer W. At the same time, the optical device wafer W is divided along each V groove 13. That is, a processing load is applied from the V blade 33 to the optical device wafer W along each laser processed groove 12 in forming the V groove 13, so that excess load is hardly applied to the side surfaces of the V groove 13 and the generation of cracks on the side surfaces of each device chip C can therefore be suppressed. Further, the inclined surfaces 17 of each device chip C can be formed by the side surfaces of each V groove 13 formed on the optical device wafer W, thereby increasing the amount of light to be extracted from each device chip C and accordingly improving the luminance.

Figure 4A:
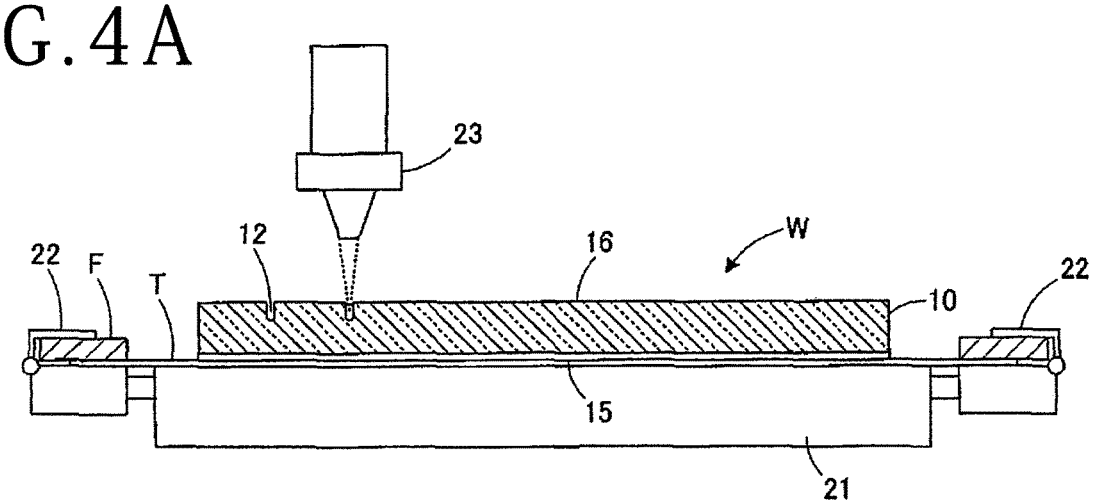
FIGS. 4A, 4B, and 4C are sectional views for illustrating an optical device wafer processing method according to a second embodiment of the present invention.
Figure 4B:
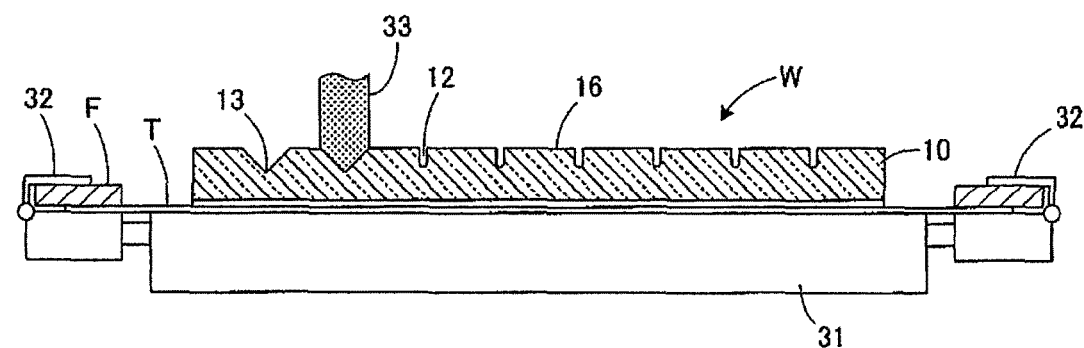
Figure 4C:
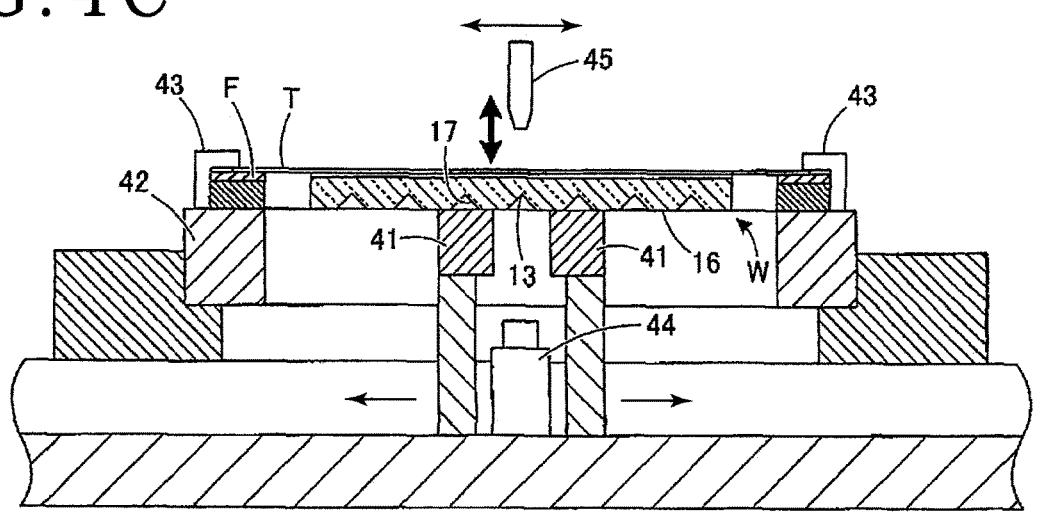

An optical device wafer processing method according to a second embodiment of the present invention will now be described with reference to FIGS. 4A, 4B, and 4C. FIGS. 4A, 4B, and 4C are sectional views for illustrating the optical device wafer processing method according to the second embodiment. More specifically, FIG. 4A is a sectional view showing a laser processed groove forming step in the optical device wafer processing method, FIG. 4B is a sectional view showing a V groove forming step in the optical device wafer processing method, and FIG. 4C is a sectional view showing a dividing step in the optical device wafer processing method. The second embodiment is different from the first embodiment in that the formation of V grooves on the optical device wafer W and the division of the optical device wafer W are separately performed. Accordingly, the description of the other similar configuration in the second embodiment will be minimized.

As shown in FIG. 4A, the laser processed groove forming step is first performed. In the laser processed groove forming step, a laser beam is applied from a laser head 23 to the optical device wafer W held on a chuck table 21 to thereby form a laser processed groove 12 on the back side 16 of the optical device wafer W along each division line. As a result, the strength of the optical device wafer W is reduced in the periphery of each laser processed groove 12. Furthermore, each laser processed groove 12 functions as a crevice where the processing load by the V blade 33 (see FIG. 4B) is concentrated in forming the V groove in the next step. As in the first embodiment, the power of the laser beam is adjusted to a power higher than the power required to form each laser processed groove 12.

After performing the laser processed groove forming step, the V groove forming step is performed as shown in FIG. 4B. In the V groove forming step, the optical device wafer W held on a chuck table 31 is fed in a horizontal direction relative to the V blade 33 to thereby form a V groove 13 along each laser processed groove 12 (each division line) on the back side 16 of the optical device wafer W. As a result, the processing load by the V blade 33 is concentrated at each laser processed groove 12, and excess processing load is hardly applied to the side surfaces of each V groove 13, so that cracks are hardly generated on the side surfaces of each V groove 13. Further, the strength of the periphery of each laser processed groove 12 can be reduced by the application of the laser beam to thereby improve the machinability. Accordingly, the wearing of the V blade 33 can be suppressed.

Since the depth of each laser processed groove 12 is set smaller than the depth of cut by the V blade 33, each laser processed groove 12 can be completely removed by the V blade 33 in forming the V groove 13. Accordingly, debris deposited on the inside surface of each laser processed groove 12 can be completely removed by the V blade 33. As a result, there is no possibility that the debris may be left on the side surfaces of each device chip C (see FIG. 2A), so that the luminance can be improved. As similar to the first embodiment, a crack 14 (see FIG. 3C) may extend downward from the bottom of a part of the laser processed grooves 12 due to the processing load by the V blade 33 in the V groove forming step in the second embodiment.

Further, the optical device wafer W may be divided along a part of the division lines due to the extension of the crack 14 in the V groove forming step in the second embodiment.

After performing the V groove forming step, the dividing step is performed as shown in FIG. 4C. In the dividing step, the optical device wafer W is placed on a pair of support members 41 included in a breaking apparatus (not shown) in the condition where the back side 16 where the V grooves 13 have been formed is oriented downward. Further, the ring frame F supporting the optical device wafer W through the support tape T is held on an annular holding table 42 and fixed by clamps 43 provided on the holding table 42. The pair of support members 41 extend in parallel in one direction (perpendicular to the sheet plane of FIG. 4C), and imaging means 44 is provided between the pair of support members 41 on the lower side thereof. The imaging means 44 functions to image each V groove 13 formed on the back side 16 of the optical device wafer W through the space defined between the pair of support members 41. The optical device wafer W is set on the pair of support members 41 in such a manner that each V groove 13 becomes parallel to the direction of extension of each support member 41.

A pressure blade 45 is provided above the pair of support members 41 so as to extend in the direction of extension of each support member 41. According to an image obtained by the imaging means 44, the pressure blade 45 is positioned directly above a target one of the V grooves 13 of the optical device wafer W. In this condition, the pressure blade 45 is lowered to press the optical device wafer W through the support tape T. Accordingly, an external force is applied to the optical device wafer W along the target V groove 13, thereby breaking the optical device wafer W along the target V groove 13. Thereafter, the pressure blade 45 is horizontally moved to the position directly above the next V groove 13 adjacent to the above target V groove 13, and the pressure blade 45 is next lowered to similarly break the optical device wafer W along this next V groove 13. Such a breaking operation is repeated to thereby divide the optical device wafer W into the individual device chips C (see FIG. 2A).

Accordingly, the inclined surfaces 17 (see FIG. 2A) of each device chip C are formed by the side surfaces of each V groove 13 of the optical device wafer W, thereby improving the light extraction efficiency of each device chip C. Further, since the generation of cracks is suppressed in forming each V groove 13, the quality of each device chip C can be improved. The dividing step may be performed by using any apparatus capable of applying an external force to the optical device wafer W along each V groove 13 to thereby divide the optical device wafer W into the individual device chips C. For example, a tape expander for expanding the support tape T may be used to apply an external force to the optical device wafer W, thereby dividing the optical device wafer W. In the second embodiment, the breaking apparatus as a special apparatus dedicated to division is used to divide the optical device wafer W, so that the optical device wafer W can be divided well and reliably.

In the optical device wafer processing method according to the second embodiment, the following effect similar to that of the first embodiment can be exhibited. The generation of cracks on the side surfaces of each device chip C can be suppressed to thereby improve the quality of each device chip C. Further, the inclined surfaces 17 of each device chip C can be formed by the side surfaces of each V groove 13 of the optical device wafer W, thereby increasing the amount of light to be extracted from each device chip C to improve the luminance.

Figure 5:
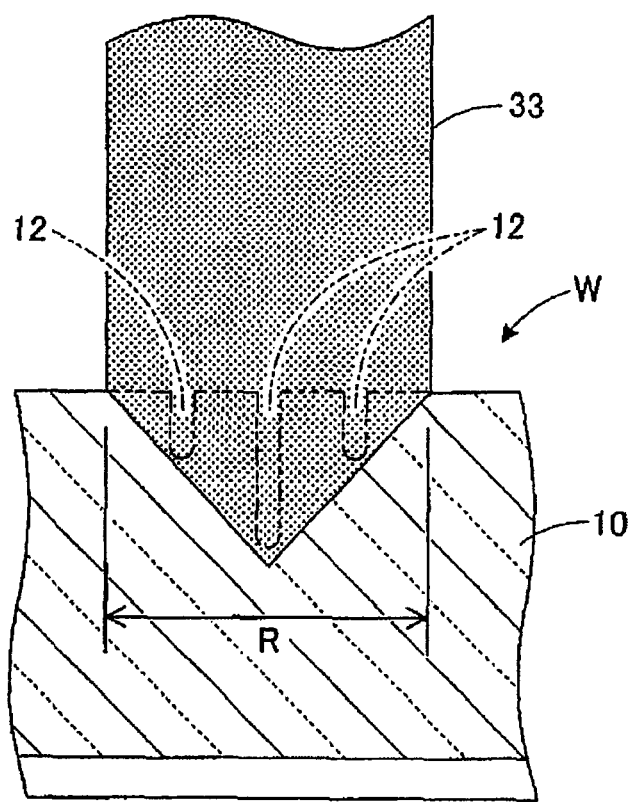
FIG. 5 is a sectional view for illustrating a laser processed groove forming step according to a modification.

While one laser processed groove 12 is formed along each division line in the laser processed groove forming step in the first or second embodiment, the present invention is not limited to this configuration. FIG. 5 is a sectional view showing a modification of the laser processed groove forming step. In this modification, a plurality of laser processed grooves 12 are formed along each division line in an area R where the back side 16 of the optical device wafer W is to be removed by the V blade 33. With this configuration, the amount of the optical device wafer W to be removed by the V blade 33 in forming each V groove 13 can be reduced. Accordingly, the machinability of the optical device wafer W can be further improved owing to the formation of the plural laser processed grooves 12 along each division line. As a result, the life of the V blade 33 can be further extended.

While each laser processed groove 12 formed in the laser processed groove forming step in the first or second embodiment is continuous, each laser processed groove 12 may be discontinuous.

In the first or second embodiment, the laser processed groove 12 is formed on the back side 16 of the optical device wafer W along each division line in the laser processed groove forming step, and the V groove 13 is next formed on the back side 16 of the optical device wafer W along each laser processed groove 12 in the V groove dividing step or in the V groove forming step. As a modification, the laser processed groove 12 may be formed on the front side 15 (on the light emitting layer 11) of the optical device wafer W in the laser processed groove forming step, and the V groove 13 may be next formed on the front side 15 of the optical device wafer W along each laser processed groove 12 in the V groove dividing step or in the V groove forming step.

While the optical device wafer W is composed of a sapphire substrate and a GaN-based light emitting layer formed on the sapphire substrate in the first or second embodiment, the configuration of the optical device wafer W is not limited. That is, the sapphire substrate may be replaced by any other substrates such as a silicon carbide substrate and a silicon substrate, and the light emitting layer may be formed of any other materials according to colors of light to be emitted.

Further, the first and second embodiments and various modifications may be combined generally or partially to perform other preferred embodiments.

Further, the present invention is not limited to the above preferred embodiments and modifications mentioned above, but various modifications, replacements, and changes may be made within the scope of the present invention. Further, if the technical idea of the present invention can be realized by any other methods using any technical progress or derivative techniques, the present invention may be embodied by using these methods. Accordingly, the present invention claimed herein is intended to cover all embodiments that may fall within the scope of the present invention.

Further, while the present invention is applied to an optical device wafer dividing method in the above preferred embodiments, the present invention is applicable also to a processing method for any substrate for the purpose of forming the inclined surfaces of each device chip.

As described above, the present invention has an effect that even when the substrate of the optical device wafer has high Mohs hardness, the inclined surfaces of each device chip can be formed by dividing the optical device wafer. In particular, the present invention is useful as an optical device wafer processing method for processing an optical device wafer composed of a sapphire substrate and a GaN-based light emitting layer formed on the sapphire substrate.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. An optical device wafer processing method for dividing an optical device wafer along a plurality of division lines formed on the front side of said optical device wafer to obtain a plurality of individual device chips, said optical device wafer being composed of a wafer substrate and a light emitting layer formed on said wafer substrate, said light emitting layer having a plurality of optical devices individually corresponding to said device chips, said optical device wafer processing method comprising:
   a laser processed groove forming step of applying a laser beam having an absorption wavelength to said wafer substrate, to said optical device wafer along each division line, thereby forming a plurality of laser processed grooves along each division line on said optical device wafer, wherein each of said plurality of laser processed grooves has a plurality of surfaces; and
   a V groove dividing step of forming a V groove along each laser processed groove on said optical device wafer by using a cutting blade having a V-shaped tip in the condition where all of said surfaces of said plurality of laser processed grooves are removed by said cutting blade, after performing said laser processed groove forming step, and simultaneously dividing said optical device wafer into said individual device chips due to a load applied from said cutting blade;
   the depth of each laser processed groove being set smaller than the depth of cut by said cutting blade.

2. The optical device wafer processing method according to claim 1, wherein each of said plurality of laser processed grooves has a depth in said optical wafer, and said depths of at least two of said plurality of laser processed grooves are different.

3. The optical device wafer processing method according to claim 1, wherein said laser processed groove forming step includes forming at least three laser processed grooves along each division line on said optical device wafer.

4. An optical device wafer processing method for dividing an optical device wafer along a plurality of division lines formed on the front side of said optical device wafer to obtain a plurality of individual device chips, said optical device wafer being composed of a wafer substrate and a light emitting layer formed on said wafer substrate, said light emitting layer having a plurality of optical devices individually corresponding to said device chips, said optical device wafer processing method comprising:
   a laser processed groove forming step of applying a laser beam having an absorption wavelength to said wafer substrate, to said optical device wafer along each division line, thereby forming a plurality of laser processed grooves along each division line on said optical device wafer, wherein each of said plurality of laser processed grooves has a plurality of surfaces;
   a V groove forming step of forming a V groove along each division line on said optical device wafer by using a cutting blade having a V-shaped tip, where all of said surfaces of said plurality of laser processed grooves are removed by said cutting blade, after performing said laser processed groove forming step; and
   a dividing step of applying an external force to said optical device wafer along each V groove after performing said V groove forming step, thereby dividing said optical device wafer into said individual device chips;

the depth of each laser processed groove being set smaller than the depth of cut by said cutting blade.

5. The optical device wafer processing method according to claim 4, wherein said dividing step includes applying an external force to a side of said optical device wafer that is opposite to the front side of said optical device wafer, by each V groove.

6. The optical device wafer processing method according to claim 4, wherein said laser processed groove forming step includes forming at least three laser processed grooves along each division line on said optical device wafer.

7. An optical device wafer processing method for dividing an optical device wafer along a plurality of division lines formed on the front side of said optical device wafer to obtain a plurality of individual device chips, said optical device wafer being composed of a wafer substrate and a light emitting layer formed on said wafer substrate, said light emitting layer having a plurality of optical devices individually corresponding to said device chips, said optical device wafer processing method comprising:

a laser processed groove forming step of applying a laser beam having an absorption wavelength to said wafer substrate, to said optical device wafer along each division line, thereby forming a plurality of laser processed grooves along each division line on said optical device wafer;

a V groove forming step of forming a V groove along each division line on said optical device wafer by using a cutting blade having a V-shaped tip in the condition where said plurality of laser processed grooves are removed by said cutting blade, after performing said laser processed groove forming step; and a dividing step of applying an external force to said optical device wafer along each V groove after performing said V groove forming step, thereby dividing said optical device wafer into said individual device chips;

the depth of each laser processed groove being set smaller than the depth of cut by said cutting blade, wherein said depths of at least two of said plurality of laser processed grooves are different.

8. The optical device wafer processing method according to claim 7, wherein said dividing step includes applying an external force to a side of said optical device wafer that is opposite to the front side of said optical device wafer, by each V groove.

9. The optical device wafer processing method according to claim 8, wherein said dividing step includes applying the external force with a pressure blade to the side of said optical device wafer that is opposite to the front side of said optical device wafer.

* * * * *